United States Patent
Teng et al.

(10) Patent No.: US 6,767,688 B2
(45) Date of Patent: Jul. 27, 2004

(54) PHOTORESIST COMPOSITIONS

(75) Inventors: Gary Ganghui Teng, Northboro, MA (US); James W. Thackeray, Braintree, MA (US); James F. Cameron, Cambridge, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/327,590

(22) Filed: Dec. 20, 2002

(65) Prior Publication Data

US 2003/0180657 A1 Sep. 25, 2003

Related U.S. Application Data

(60) Provisional application No. 60/344,902, filed on Dec. 31, 2001.

(51) Int. Cl.$^7$ .............................. G03C 1/73; G03C 1/74; G03F 7/039; G03F 7/20; G03F 7/30
(52) U.S. Cl. .................... 430/270.1; 430/905; 430/914; 430/326; 430/909; 430/910; 430/271.1; 430/272.1; 430/925
(58) Field of Search ............................. 430/270.1, 905, 430/914, 326, 909, 910, 271.1, 272.1, 925

(56) References Cited

U.S. PATENT DOCUMENTS 4,511,641 A * 4/1985 Busman et al. ............. 430/158
6,136,501 A * 10/2000 Trefonas et al. ......... 430/270.1
6,548,220 B2 * 4/2003 Uetani et al. ............ 430/270.1

OTHER PUBLICATIONS

A page printed from WIKIPEDIA, The Free Encyclopedia (provided on the Internet).*

* cited by examiner

*Primary Examiner*—Mark F. Huff
*Assistant Examiner*—Sin J. Lee
(74) *Attorney, Agent, or Firm*—Peter F. Corless; Darryl P. Frickey; Edwards & Angell, LLP

(57) ABSTRACT

New photoresist compositions are provided that contain a halogenated salt, particularly a halogenated counter ion of an ammonium or alkyl ammonium salt. Preferred photoresists of the invention are chemically-amplified positive resists and contain an ammonium or alkyl ammonium salt that has a halogenated anion component such as a halogenated alkyl sulfonate or carboxylate anion component. Inclusion of the halogenated organic salt in a photoresist composition can provide enhanced lithographic performance.

16 Claims, No Drawings

PHOTORESIST COMPOSITIONS

The present application claims the benefit of U.S. provisional application No. 60/344,902, filed Dec. 31, 2001, which is incorporated herein by reference in its entirety.

BACKGROUND OF THE INVENTION

1. Field of the Invention

The present invention relates to new photoresist compositions that contain a halogenated salt. Preferred resists of the invention contain an ammonium or alkyl ammonium salt that has a halogenated anion component such as a halogenated alkyl sulfonate or carboxylate anion component.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble.

In general, photoresist compositions comprise at least a resin binder component and a photoactive agent. Photoresist compositions are described in Deforest, *Photoresist Materials and Processes*, McGraw Hill Book Company, New York, ch. 2, 1975 and by Moreau, *Semiconductor Lithography, Principles, Practices and Materials*, Plenum Press, New York, ch. 2 and 4, both incorporated herein by reference for their teaching of photoresist compositions and methods of making and using the same.

Chemically-amplified-type resists have been increasingly employed, particularly for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically-amplified resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,581; 4,883,740; 4,810,613; and 4,491,628, and Canadian Patent Application 2,001,384. Upon cleavage of the blocking group through exposure of a coating layer of such a resist, a polar functional group is formed, e.g., carboxyl or imide, which results in different solubility characteristics in exposed and unexposed areas of the resist coating layer. See also R. D. Allen et al., *Proceedings of SPIE*, 2724:334–343 (1996); and P. Trefonas et al. *Proceedings of the 11$^{th}$ International Conference on Photopolymers (Soc. Of Plastics Engineers)*, pp 44–58 (Oct. 6, 1997).

While currently available photoresists are suitable for many applications, current resists also can exhibit significant shortcomings, particularly in high performance applications such as formation of highly resolved sub-half micron and sub-quarter micron features.

It thus would be desirable to have new photoresist compositions, particularly resist compositions that can be imaged at short wavelengths such as 248 nm or 193 nm. It would be particularly desirable to have such resist compositions that can provide high resolution relief images.

SUMMARY OF THE INVENTION

The present invention provides new photoresist compositions that contain a halogenated organic salt, particularly a compound having a halogenated anion component and an ammonium (amine) or alkyl ammonium cation component.

More particularly, resists of the invention in general comprise a resin, a photoactive component such as one or more photoacid generator compounds, and a halogenated organic salt. The organic salt is typically basic (alkaline), particularly a pKa of about 4 or higher (larger number), more preferably a pKa of 5, 6, 7, 8, or 9 or higher.

Preferred halogenated organic salt additive compounds of resists of the invention are relatively small molecules, more particularly having a molecular weight of less than about 1000, 800 or 700 daltons, more preferably a molecular weight of less than about 600, 500, 400, 300 or 200 daltons. Preferred halogenated organic salt additive compounds of resists of the invention typically will have a molecular weight of at least about 40 or 50, more typically at least about 60, 70, 80, 90 or 100. Preferred halogenated organic salt additive compounds are non-polymeric.

Particularly preferred haloganted organic salts are ammonium and alkyl amine salts, e.g. compounds of the formula $NH_4 \cdot M$ and $(C_{1-12}alkyl)_m(H)_nN \cdot M$ where M is an organic counter that is halogenated, preferably fluorinated and may be preferably perfluorinated, m is 1 to 4, n is 0 to 3, and the sum of m and n is 4.

Preferred organic counter ions (such as M of the above formulae) are alkylsulfonates, particularly halogenated alkylsulfonates such as those of the formula $C_{1-24}alkylSO_2O-$ or $C_{1-16}alkylSO_2O-$ where the alkyl group has one or more halogen substituents, preferably one or more fluoro substituents, and the alkyl group may be preferably a perfluoroalkyl substituent. Suitable organic counter ions M also include halogenated alkyl carboxylates such as those of the formula $C_{1-24}alkylCOO-$ or $C_{1-16}alkylCOO-$ where the alkyl group has one or more halogen substituents, preferably one or more fluoro substituents, and the alkyl group may be preferably a perfluoroalkyl substituent.

We have surprisingly found that addition of such a halogenated organic salt (e.g. a halogenated alkylsulfonate or alkylcarboxylate amine salt) to a photoresist can significantly increase lithographic performance of the photoresist, including with respect to photospeed, reduced line edge roughness, reduced footing, reduced post-exposure bake sensitivity, and/or increased depth of focus. See, for instance, the data set forth in the examples which follow.

The photoresists of the invention preferably are chemically-amplified positive resists, which utilize photoacid-induced cleavage of pendant polymer groups of the resin binder to provide solubility differentials between exposed and unexposed areas of a resist coating layer. Preferred deblocking polymers for use as a resin binder component of resists of the invention include acrylate resins that have pendant ester groups that can react to provide polar acid groups in the presence of photogenerated acid.

For imaging at wavelengths greater than 200 nm, a resist suitably contains a resin that comprises aromatic groups, such as phenyl groups, particularly phenolic groups. Alkylacrylate/phenolic copolymers are particularly preferred, such as polymers that comprise repeat units of polymerized vinyl phenol and an alkyl acrylate such as t-butylacrylate or t-butylmethacrylate.

For imaging at 193 nm, resists of the invention suitably comprise a resin component that is substantially free of any phenyl or other aromatic groups. For example, preferred polymers contain less than about 5 or 1 mole percent aromatic groups, more preferably less than about 0.1, 0.02, 0.04 or 0.08 mole percent aromatic groups, and still more preferably less than about 0.01 mole percent aromatic groups. Particularly preferred polymers are completely free of aromatic groups. Aromatic groups can be highly absorbing of sub-200 nm radiation and thus are undesirable for polymers used in photoresists of the invention for short wavelength imaging applications.

In addition to a resin, a photoactive component, and a halogenated organic salt, resists of the invention may contain an additional basic additive, e.g. an amine compound which suitably may be an amine salt distinct from the halogenated organic salt. Such additional basic additive also may be a non-ionic compound, e.g. an aliphatic or aromatic amine such as diethyl amine, pyridine and the like.

Preferably the added amine is used in relatively large amounts, e.g. where the added amine is present in a weight amount equal to at least about 10, 20, 30, 40, 50, 60, 70, 80, 90 or 100 weight percent relative to the weight of the halogenated organic salt in a photoresist composition. See, for instance, the results set forth in Example 5 which follows.

In those systems that contain both a halogenated organic salt and an added, distinct base, it is generally preferred that the halogenated organic salt is used in a molar excess with respect to the additional, distinct base (distinct base), e.g. where the halogenated salt is present in a molar amount of 1.1, 1.5, 2 or 3 times with respect to the molar amount of the distinct base in a photoresist composition.

The invention also provides methods for forming relief images, including methods for forming a highly resolved relief image such as a pattern of lines where each line has essentially vertical sidewalls and a line width of about 0.40 microns or less, and even a width of about 0.25 or 0.20 microns or less. The invention further provides articles of manufacture comprising substrates such as a microelectronic wafer substrate or liquid crystal display or other flat panel display substrate having coated thereon a photoresist or resist relief image of the invention. The invention also includes methods for manufacturing such articles, particularly semiconductor chips, using a photoresist of the invention.

Other aspects of the invention are disclosed infra.

DETAILED DESCRIPTION OF THE INVENTION

As indicated above, photoresists of the invention are preferably chemically-amplified positive resists that in general comprise a resin binder, a photoresist component that typically comprises one or more photoacid generator compounds (PAGs), and a halogenated salt basic additive, particularly a halogenated amine salt.

The halogenated organic salt may be suitably used in a relatively wide range of amounts in a photoresist composition of the invention. For example, an organic salt additive may be present in an amount of about 0.1 to 5 to 10 weight percent, based on total solids (all components except solvent) of a resist composition.

Also, as discussed above, the halogenated organic salt is typically basic with a pKa of about 4 or greater (i.e. higher number pKa value), more preferably a pKa of about 5, 6, 7, 8, 9 or higher. As used herein, the term "pKa" is used in accordance with its art recognized meaning, i.e., pKa is the negative log (to the base 10) of the dissociation constant of the organic salt in aqueous solution at about room temperature (25° C.).

Preferably the anion component of the organic salt is halogenated, particularly fluorinated, e.g. where the anion component comprises one or more haloalkyl substituents such as one or more $C_{1-18}$haloalkyl substituents, particularly one or more $C_{1-18}$fluoroalkyl substituents, inclusive of perhaloalkyl and perfluoroalkyl substituents such as —$CF_3$, —$CF_2CF_3$ and the like.

The cation component of the organic salt also may be halogenated, particularly fluorinated, such as by comprising one or more haloalkyl substituents such as one or more $C_{1-18}$haloalkyl substituents, particularly one or more $C_{1-18}$fluoroalkyl substituents, inclusive of perhaloalkyl and perfluoroalkyl substituents such as —$CF_3$, —$CF_2CF_3$ and the like. In certain embodiments however, it may be preferred that only the anion component is halogenated, and the cation component of the organic salt is free of halogen substitution, or at least fluoro substitution. In other embodiments, it may be preferred that only the cation component is halogenated, and the anion component of the organic salt is free of halogen substitution, or at least fluoro substitution.

While fluorine substitution of the organic salt compound is often preferred, the organic salt also may have other halogen substitution, e.g. Cl, Br and/or I substitution, may typically Cl and/or Br substitution.

Particularly preferred photoresists of the invention contain a photoactive component, a halogenated organic basic salt as discussed above and a resin that is selected from the group of:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793, incorporated herein by reference; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997, incorporated herein by reference; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526, incorporated herein by reference, as well as blends of i) and/or ii) and/or iii);

2) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048,664, incorporated herein by reference; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. pending patent application Ser. No. 09/143,462, all incorporated herein by reference, and iii) polymers that contain polymerized anhydride units, particularly polymerized maleic anhydride and/or itaconic anhydride units, such as disclosed in European Published Application EP01008913A1 and U.S. Pat. No. 6,048,662, both incorporated herein by reference, as well as blends of i) and/or ii) and/or iii);

3) a resin that contains repeat units that contain a hetero atom, particularly oxygen and/or sulfur (but other than an anhydride, i.e. the unit does not contain a keto ring atom), and preferable are substantially or completely free of any aromatic units. Preferably, the heteroalicyclic unit is fused to the resin backbone, and further preferred is where the resin comprises a fused carbon alicyclic unit such as provided by polymerization of a norborene group and/or an anhydride unit such as provided by polymerization of a maleic anhydride or itaconic anhydride. Such resins are disclosed in WO 018635 and U.S. Pat. No. 6,306,554 to Barclay et al.

4) a resin that contains fluorine substitution (fluoropolymer), e.g. as may be provided by polymerization of tetrafluoroethylene, a fluorinated aromatic group such as fluoro-styrene compound, compounds that comprise a hexafluoroalcohol moiety, and the like. Examples of such resins are disclosed e.g. in WO 00/17712 and WO 00/67072.

Generally preferred, for at least many applications, are resist resins that contain pendant photoacid-labile groups that can be provided e.g. by reaction of acrylate monomers. For example, suitable deblocking pendant ester groups include those of the Formula —WC(=O)OR$^5$, wherein W is a linker such as a chemical bond, an alkylene particularly $C_{1-3}$alkylene, carbocyclic aryl such as phenyl, or aryloxy such as phenoxy, and R$^5$ is a suitable ester moiety that can promote a deblocking reaction in the present of photogenerated acid such as an optionally substituted alkyl (including cycloalkyl) suitably having from 3 to about 20 carbon atoms, more preferably 4 to about 20 carbon atoms; optionally substituted alkenyl (including cycloalkenyl) group suitably having from 3 to about 20 carbon atoms, more preferably about 4 to about 20 carbon atoms; optionally substituted optionally substituted alkynyl group suitably having from 3 to about 20 carbon atoms, more preferably about 4 to about 20 carbon atoms; optionally substituted alkoxy suitably having 3 to about 20 carbon atoms, preferably 4 to about 20 carbon atoms, or a heteroalicyclic group that contains one or more N, O or S atoms and one or more rings having from 4 to about 8 ring members such as tetrahydrofuranyl, thienyl, tetrahydropyranyl, morpholino and the like. Specifically preferred R$^5$ groups include e.g. t-butyl, tetrahydropyran, ethoxyethyl, or an alicyclic group including bridged groups such as adamantyl including 2-methyl-2-admantyl, norbornyl, isobornyl, and the like. Also preferred are polymers having ester repeat units of the above Formula where R$^5$ is a noncyclic single ring alkyl group having 5 or more carbons and two or more secondary or tertiary carbon radicals, such as pendant esters of the structures disclosed in U.S. Pat. No. 6,136,501 assigned to the Shipley Company.

Polymers for use as a resin component also may have other units such as pendant cyano and itaconic anhydride groups. Preferably, the itaconic anhydride moiety will be directly pendant to the polymer backbone, i.e. the moiety is directly pendant to a polymer bridge group without any alkylene, aryl or other group interposed between the polymer bridge group and the itaconic anhydride group. While a cyano group also is preferably directly pendant to the polymer backbone, a linker group also may be interposed between the cyano group and a polymer bridge group.

For resists imaged at 248 nm, preferred resins include copolymers that comprise phenolic units and photoacid-labile alkyl acrylate units, such as resins disclosed in U.S. Pat. Nos. 6,042,997 and 5,492,793. Such polymers can be provided by polymerization of an alkyl acrylate copolymer such as a copolymer comprising polymerized units of t-butylmethacrylate, vinyl phenol and styrene.

Polymers of the invention can be prepared by a variety of methods. One suitable method is free radical polymerization, e.g. by reaction of selected monomers to provide the various units as discussed above in the presence of a radical initiator under an inert atmosphere (e.g. $N_2$ or argon) and at elevated temperatures such as about 70° C. or greater, although reaction temperatures may vary depending on the reactivity of the particular reagents employed and the boiling point of the reaction solvent (if a solvent is employed). Suitable reaction temperatures for any particular system can be readily determined empirically by those skilled in the art based on the present disclosure. Monomers that can be reacted to provide a polymer of the invention can be readily identified by those skilled in the art based on the present disclosure. For example, suitable monomers include e.g. vinylphenol, styrene, acrylonitrile, methacrylonitrile, allylcyanide, itaconic anhydride and the like. A variety of free radical initiators may be employed to prepare resins used in resists of the invention. For example, azo compounds may be employed such as azo-bis-2,4-dimethylpentanenitrile. Peroxides, peresters, peracids and persulfates also could be employed.

Preferably, a polymer used as a resin component of a resist of the invention will have a weight average molecular weight (Mw) of about 1,000 to about 100,000, more preferably about 2,000 to about 30,000, still more preferably from about 2,000 to about 15,000 or 20,000, with a molecular weight distribution (Mw/Mn) of about 3 or less, more preferably a molecular weight distribution of about 2 or less. Molecular weights (either Mw or Mn) of resins as disclosed herein are suitable determined by gel permeation chromatography.

The resin component is suitably used in a photoresist composition in an amount sufficient to render a coating layer of the resist developable with an aqueous alkaline developer.

As discussed above, resist compositions of the invention also comprise a photoactive component which typically comprises one or more photoacid generator compounds (i.e. "PAG"s). The photoactive component is suitably employed in an amount sufficient to generate a latent image in a coating layer of the resist upon exposure to activating radiation. Preferred PAGs for imaging at 193 nm and 248 nm imaging include imidosulfonates such as compounds of the following formula:

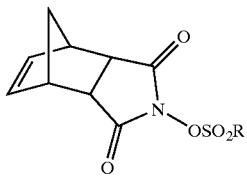

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs, particularly sulfonate salts. Two suitable agents for 193 nm and 248 nm imaging are the following PAGS 1 and 2:

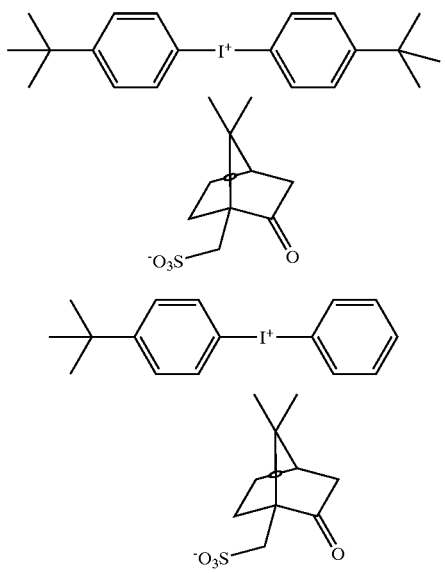

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3$— where R is adamantane, alkyl (e.g. $C_{1-12}$ alkyl) and perfluoroalkyl such as perfluoro ($C_{1-12}$ alkyl), particularly perfluorooctanesulfonate, perfluorobutanesulfonate and the like.

Also preferred is a triphenyl sulfonium PAG, complexed with anions such as the sulfonate anions mentioned above, particularly a perfluoroalkyl sulfonate such as perfluorobutane sulfonate.

Other known PAGS also may be employed in the resists of the invention.

Photoresists of the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

The resists of the invention can be readily prepared by those skilled in the art. For example, a photoresist composition of the invention can be prepared by dissolving the components of the photoresist in a suitable solvent such as, for example, 2-heptanone, cyclohexanone, ethyl lactate, ethylene glycol monomethyl ether, ethylene glycol monomethyl ether acetate, propylene glycol monomethyl ether; propylene glycol monomethyl ether acetate and 3-ethoxyethyl propionate. Typically, the solids content of the composition varies between about 5 and 35 percent by weight of the total weight of the photoresist composition. The resin binder and photoactive components should be present in amounts sufficient to provide a film coating layer and formation of good quality latent and relief images. See the examples which follow for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 $mJ/cm^2$, dependent upon the exposure tool and the components of the photoresist composition.

As discussed above, coating layers of the resist compositions of the invention are preferably photoactivated by a short exposure wavelength, particularly sub-300 nm exposure wavelengths such as 248 nm. However, the resist compositions of the invention also may be suitably imaged at higher wavelengths. For example, a resin of the invention can be formulated with an appropriate PAG and used as a chemically-amplified positive I-line resist, i.e. a resist imaged at about 365 nm. Resists of the invention also will be useful for exposure with electron beams (E-beam exposure) and extreme-UV exposure (EUV) such as sub-50 nm or sub-20 nm exposure, particularly 13 nm exposure.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as quaternary ammonium hydroxide solutions such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

All documents mentioned herein are incorporated herein by reference. The following non-limiting examples are illustrative of the invention.

EXAMPLE 1

This example demonstrates that addition of a halogenated organic salt in a chemically amplified photoresist formulation can improve the photospeed and lithographic profile of the resist. The resists were prepared as a 16.94% solution in ethyl lactate with the following solids composition (weight ratio).

| Description | % Solids Ratio |
|---|---|
| p-Hydroxystyrene-styrene-t-butylacrylate copolymer (65:20:15 molar ratios of respective units, i.e. the polymer consisted of 65 mole percent p-hydroxystyrene units, 20 mole percent of styrene units and 15 mole percent of t-butylacrylate units) | 94.88 |
| Di-t-butyl phenyl iodonium camphorsulfonate | 4.74 |
| Tetrabutyl ammonium hydroxide (TBAH) | 0.38 |
| Sulfonate salt additive (Listed in table below) | (Listed in table below) |

The resists were spin coated over an organic antireflective composition coating layer on 6" silicon wafers to achieve a thickness of about 7000 Å and baked at 130° C. for 60 seconds. The coated wafers were exposed on a GCA XLS 7800 DUV stepper equipped with a KrF laser (248 nm) for a test pattern, followed by 130° C. post exposure bake (PEB) for 90 seconds and development with an aqueous alkaline developer solution. The spin coating, development, and all baking processes were performed on a TEL Mark 8 track. The developed wafers were cross-sectioned and evaluated by scanning electron microscope for exposure latitude and focus latitude (DOF) using 180 nm lines and spaces. Photospeed (Eo) was defined as the minimum exposure (through open-frame) required to allow complete development of the resist.

The lithographic performance of the resists with various additives is listed in the following table. The amount of additive is based on the total solid weight of the resist. (Total slid weight refers to herein as the weight of all resist components except solvent carrier).

| Sulfonate Additive | Amount (%) | Photospeed Eo (mJ/cm$^2$) | DOF (micron) | Lithographic Profile |
|---|---|---|---|---|
| None | 0.0 | 6.0 | 0.9 | Slight rough top; slight footing |
| $C_{10}F_{21}SO_3NH_4$ | 0.1 | 5.5 | 0.9 | Smooth top; less footing |
| $C_{10}F_{21}SO_3NH_4$ | 0.2 | 5.1 | 0.75 | Some rounding |
| $C_{10}F_{21}SO_3NH_4$ | 0.5 | 2.5 | — | — |
| $C_8F_{17}SO_3NH_4$ | 0.1 | 5.3 | 0.75 | Smooth top; slight footing |

EXAMPLE 2

This example demonstrates that addition of a halogenated organic salt in a chemically amplified photoresist formulation can improve the lithographic profile of the resist.

The same control formulation as in Example 1 was used for this Example 2. The resists were tested with the same process as in Example 1. The lithographic performance of the resists with various additives are listed in the following table. The amount of additive is based on the total solid weight of the resist.

| Sulfonate Additive | Amount (%) | Photospeed Eo (mJ/cm$^2$) | DOF (micron) | Lithographic Profile |
|---|---|---|---|---|
| None | 0.0 | 6.0 | 0.9 | Slight rough top; slight footing |
| $C_8F_{17}SO_3NBu_4$ | 0.2 | 5.9 | 0.9 | Smooth top |
| $C_8F_{17}SO_3NBu_4$ | 1.0 | 5.8 | 0.6 | Smooth but slight rough top |
| $C_8F_{17}SO_3NEt_4$ | 0.2 | 5.9 | 0.9 | Smooth top |
| $C_8F_{17}SO_3NEt_4$ | 1.0 | 5.8 | 0.75 | Smooth but slight rough top |
| $CF_3SO_3NBU_4$ | 0.3 | 6.0 | 1.05 | Smooth top; less footing |

EXAMPLE 3

In this example, a halogenated organic salt together with additional base additive was added into a chemically amplified photoresist formulation to improve the lithographic profile and DOF of the resist. The resists were prepared as a 16.94% solution in ethyl lactate with the following solids composition (weight ratios).

| Description | % Solids Ratio |
|---|---|
| p-Hydroxystyrene-styrene-t-butylacrylate copolymer (65:20:15 molar ratios) | 94.88 |
| Di-t-butyl phenyl iodonium camphorsulfonate | 4.74 |
| Tetrabutyl ammonium hydroxide (TBAH) | 0.38 |
| Sulfonate salt additive (Listed in table below) | (Listed in table) |
| Additional Tetrabutyl ammonium hydroxide (TBAH) | (Listed in table) |

The resists were processed the same as in Example 1. The lithographic performance of the resists with various additives are listed in the following table. The amount of additive is based on the total solids weight of the resist.

| Sulfonate Additive | Sulfonate Amount (%) | Additional TBAH | DOF (micron) | Lithographic Profile |
|---|---|---|---|---|
| None | 0.0 | 0.0 | 0.9 | Slight rough top; slight footing |
| C$_{10}$F$_{21}$SO$_3$NH$_4$ | 1.2 | 0.6 | 1.05 | Smooth top; less footing |
| C$_8$F$_{17}$SO$_3$NH$_4$ | 1.0 | 0.6 | 0.9 | Smooth top; less footing |
| CF$_3$SO$_3$NH$_4$ | 0.32 | 0.6 | 1.05 | Smooth top; less footing |

EXAMPLE 4

In this example, Si$_3$N$_4$ coated silicon wafer was used instead of organic antireflective coating. The resists were prepared as an 18.0% solution in ethyl lactate with the following solids composition (weight ratios).

| Description | % Solids Ratio |
|---|---|
| p-Hydroxystyrene-styrene-t-butylacrylate copolymer (65:20:15 molar ratios) | 94.85 |
| Di-t-butyl phenyl iodonium camphorsulfonate | 4.74 |
| Tetrabutyl ammonium hydroxide (TBAH) | 0.38 |
| Silwet 7604 (from Union Carbide) | 0.03 |
| Sulfonate salt additive (Listed in table below) | (Listed in table) |
| Additional tetrabutyl ammonium hydroxide (TBAH) | (Listed in table) |

The above formulations were spin coated onto Si$_3$N$_4$ coated silicon wafer to achieve a thickness of about 8000 Å and baked at 130° C. for 60 seconds. The coated wafers were exposed on a GCA XLS 7800 DUV stepper equipped with a KrF laser (248 nm) for a test pattern, followed by 140° C. post exposure bake (PEB) for 90 seconds and development for 45 seconds with an aqueous alkaline developer solution. The spin coating, development, and all baking processes were performed on a TEL Mark 8 track. The developed wafers were evaluated by scanning electron microscope for lithographic profiles for 220 nm trench feature size.

The lithographic performance of the resists with various additives is listed in the following table. The amount of additive is based on the total solid weight of the resist.

| Sulfonate Additive | Sulfonate Amount (%) | Additional TBAH | DOF (micron) | Lithographic Profile |
|---|---|---|---|---|
| None | 0.0 | 0.0 | 0.3 | Footing and rough edge |
| C$_{10}$F$_{21}$SO$_3$NH$_4$ | 1.2 | 0.6 | 0.6 | No footing and smooth edge |

EXAMPLE 5

This example demonstrates that addition of a halogenated organic salt together with additional base additive can reduce the post-exposure bake (PEB) temperature sensitive of the resist.

The resists listed in Example 3 were tested for PEB sensitivity. The resists were processed the same as in Example 1, except that the PEB temperatures at 125, 130 and 135° C., respectively, were used. The line widths of 250 nm lines (1:1 line/space ratio) were measured. The line widths and PEB sensitivity data are listed below. The amount of additive is based on the total solid weight of the resist.

| Sulfonate Additive | Sulfonate Amount (%) | Additional TBAH | Average PEB Sensitive (nm/° C.) | | |
|---|---|---|---|---|---|
| | | | 125–130° C. | 130–135° C. | 125–135° C. |
| None | 0.0 | 0.0 | 9.6 | 10.5 | 10.5 |
| C$_{10}$F$_{21}$SO$_3$NH$_4$ | 1.2 | 0.6 | 5.2 | 8.6 | 7.0 |
| C$_8$F$_{17}$SO$_3$NH$_4$ | 1.0 | 0.6 | 8.5 | 9.8 | 9.8 |

The foregoing description of the invention is merely illustrative thereof, and it is understood that variations and modification can be made without departing from the spirit or scope of the invention as set forth in the following claims.

What is claimed is:

1. A positive-acting photoresist composition comprising:
   (a) a resin that comprises photoacid-labile groups;
   (b) one or more photoacid generator compounds; and
   (c) as a separate component from one or more photoacid generators of the composition, one or more compounds chosen from formula (I) or (II)

$$NH_4.M \quad (I)$$

$$(C_{1\text{-}12}\text{alkyl})_m(H)_n N.M \quad (II)$$

wherein M is a halogenated anion, m is 1 to 4, n is 0 to 3 and the sum of m and n is 4.

2. The photoresist composition of claim 1 wherein the photoresist comprises one or more compounds of formula I.

3. The photoresist composition of claim 1 wherein the photoresist comprises one or more compounds of formula II.

4. The photoresist composition of claim 1 wherein the M is fluorinated.

5. The photoresist composition of claim 1 wherein M is perfluorinated.

6. The photoresist composition of claim 1 wherein M comprises a perfluoroalkyl substituent.

7. The photoresist composition of claim 1 wherein M comprises an alkylsulfonate.

8. The photoresist composition of claim 1 wherein M comprises an alkylcarboxylate.

9. The photoresist composition of claim 1 further comprising a basic compound distinct from the one or more compounds of formula I or formula II.

10. The photoresist composition of claim 1 wherein the resin comprises phenyl group.

11. The photoresist composition of claim 1 wherein the resin comprises phenolic units and alkyl acrylate units.

12. The photoresist composition of claim 1 wherein the resin is at least substantially free of aromatic units.

13. A method of forming a positive photoresist relief image comprising:
   (a) applying a coating layer of a photoresist composition of claim 1 on a substrate; and
   (b) exposing and developing the photoresist layer to yield a relief image.

14. The method of claim 13 wherein the photoresist layer is exposed with radiation having a wavelength of less than about 300 nm.

15. The method of claim 13 wherein the photoresist layer is exposed with radiation having a wavelength of less than about 200 nm.

16. An article of manufacture comprising a microelectronic wafer substrate having coated thereon a layer of a photoresist composition of claim 1.

* * * * *